(12) United States Patent
Kitamura et al.

(10) Patent No.: US 11,269,388 B2
(45) Date of Patent: Mar. 8, 2022

(54) ELECTRONIC APPARATUS WITH FAN DEVICE

(71) Applicant: LENOVO (SINGAPORE) PTE. LTD., Singapore (SG)

(72) Inventors: Masahiro Kitamura, Yokohama (JP); Takuroh Kamimura, Yokohama (JP); Shogo Akiyama, Yokohama (JP); Satoshi Douzono, Yokohama (JP); Akinori Uchino, Yokohama (JP)

(73) Assignee: LENOVO (SINGAPORE) PTE. LTD.

( * ) Notice: Subject to any disclaimer, the term of this patent is extended or adjusted under 35 U.S.C. 154(b) by 0 days.

(21) Appl. No.: 17/074,917

(22) Filed: Oct. 20, 2020

(65) Prior Publication Data

US 2021/0216120 A1    Jul. 15, 2021

(30) Foreign Application Priority Data

Jan. 9, 2020    (JP) .............................. JP2020002246

(51) Int. Cl.
*G06F 1/20*    (2006.01)
*H05K 7/20*    (2006.01)

(52) U.S. Cl.
CPC .......... *G06F 1/203* (2013.01); *H05K 7/20145* (2013.01); *H05K 7/20172* (2013.01)

(58) Field of Classification Search
CPC .......... G06F 1/20; G06F 1/203; G06F 1/1601; G06F 1/1616; G06F 1/1667; G06F 1/1664; G06F 1/1666
See application file for complete search history.

(56) References Cited

U.S. PATENT DOCUMENTS

| | | | | |
|---|---|---|---|---|
| 2001/0017764 A1* | 8/2001 | Nakamura | .............. | G06F 1/203 361/697 |
| 2003/0129010 A1 | 7/2003 | Chicony | | |
| 2006/0227503 A1* | 10/2006 | Ho | .......... | G06F 1/203 361/679.08 |

(Continued)

FOREIGN PATENT DOCUMENTS

| | | | | |
|---|---|---|---|---|
| CN | 103149971 A | * | 6/2013 | .......... F04D 29/601 |
| JP | 2006019384 A | | 1/2006 | |

(Continued)

*Primary Examiner* — Stephen S Sul
*Assistant Examiner* — Alexander Ryan Horton
(74) *Attorney, Agent, or Firm* — Shimokaji IP

(57) ABSTRACT

An electronic apparatus includes: an apparatus chassis including therein an electronic board; a keyboard provided on a top of the apparatus chassis; and a fan device that includes a fan chassis and a blade part. The fan chassis includes a first air intake formed on a bottom surface thereof, a second air intake formed on a top surface thereof, and an air outlet formed on a side surface thereof. The blade part rotates inside the fan chassis. The fan device is arranged between a basal plate and a bottom surface of the keyboard inside the apparatus chassis. The basal plate includes a first inlet at a position overlapping the first air intake. The keyboard includes a second inlet that makes air pass through the keyboard in an up-down direction thereof. The electronic apparatus further includes a first water stop member that separates the first air intake from the electronic board.

11 Claims, 16 Drawing Sheets

(56) References Cited

U.S. PATENT DOCUMENTS

| | | | | |
|---|---|---|---|---|
| 2007/0146988 A1* | 6/2007 | Yamagishi | ............... | G06F 1/203 |
| | | | | 361/679.08 |
| 2011/0310557 A1* | 12/2011 | Ooe | ......................... | G06F 1/203 |
| | | | | 361/692 |
| 2012/0314366 A1* | 12/2012 | Noborio | ................. | G06F 1/1658 |
| | | | | 361/692 |
| 2013/0279112 A1* | 10/2013 | Kim | ................... | H05K 7/20154 |
| | | | | 361/692 |
| 2015/0351282 A1* | 12/2015 | Fujiwara | ................. | G06F 1/203 |
| | | | | 361/696 |
| 2018/0070474 A1* | 3/2018 | Pal | ...................... | H05K 7/20136 |
| 2019/0242403 A1* | 8/2019 | Ma | ....................... | F04D 29/4226 |

FOREIGN PATENT DOCUMENTS

| JP | 2007041637 A | 2/2007 |
|---|---|---|
| JP | 2007172328 A | 7/2007 |
| JP | 2012027592 A | 2/2012 |
| JP | 2015053330 A | 3/2015 |
| JP | 2015200217 A | 11/2015 |
| JP | 2015215761 A | 12/2015 |
| JP | 2016034019 A | 3/2016 |

* cited by examiner

ELECTRONIC APPARATUS WITH FAN DEVICE

FIELD OF THE INVENTION

The present invention relates to an electronic apparatus that includes a keyboard.

BACKGROUND OF THE INVENTION

In an electronic apparatus such as a laptop PC, a heating element such as a central processing unit (CPU) is arranged inside an apparatus chassis that has a keyboard on a top surface thereof. Therefore, a fan device for cooling the heating element may be mounted inside the apparatus chassis. For example, Japanese Unexamined Patent Application Publication No. 2015-200217 discloses an electronic apparatus mounted with a fan device that has air inlets on the top and bottom surfaces of a fan chassis and has an air outlet on the side surface of the fan chassis.

The fan device as described above has a configuration that the air inside the apparatus chassis can be sucked in from the air inlet at the top and simultaneously the outside air from an inlet formed on the basal surface of the apparatus chassis can be sucked in from the air inlet at the bottom. Meanwhile, in recent years, an electronic apparatus such as a laptop PC is rapidly becoming thinner. For this reason, a fan device is difficult to secure a gap through which air flows between an air inlet at the top and a keyboard above it, and thus the air inlet at the top may be difficult to function sufficiently.

Therefore, in consideration of such a problem, there is also conceivable a configuration that vertical through-holes are formed in the keyboard for example and the outside air is sucked in from the through-holes to the air inlet at the top of the fan device. However, this configuration has a concern that, when a user spills liquid such as drink on the keyboard for example, the liquid enters the apparatus chassis via the through-holes and has an influence on a motherboard, and the like.

The present invention has been made in consideration of the problems of the conventional technology, and an object of the invention is to provide an electronic apparatus that can achieve both cooling performance and waterproof performance.

SUMMARY OF THE INVENTION

An electronic apparatus according to the first aspect of the present invention includes: an apparatus chassis including therein an electronic board; a keyboard provided on a top of the apparatus chassis; and a fan device that includes a fan chassis and a blade part. The fan chassis includes a first air intake formed on a bottom surface thereof, a second air intake formed on a top surface thereof, and an air outlet formed on a side surface thereof. The blade part rotates inside the fan chassis. The fan device is arranged between a basal plate of the apparatus chassis and a bottom surface of the keyboard inside the apparatus chassis. The basal plate includes a first inlet at a position overlapping the first air intake. The keyboard includes, at a position overlapping the second air intake, a second inlet that makes air pass through the keyboard in an up-down direction thereof. The electronic apparatus further includes a first water stop member that is provided to surround at least a part of the first air intake, lies between a bottom surface of the fan chassis and an inner surface of the basal plate, and separates the first air intake from the electronic board.

An electronic apparatus according to the second aspect of the present invention includes: an apparatus chassis including therein an electronic board; a keyboard provided on a top of the apparatus chassis; and a fan device that includes a fan chassis, a blade part, a motor part, and a control board. The fan chassis includes a first air intake formed on a bottom surface thereof, a second air intake formed on a top surface thereof, and an air outlet formed on a side surface thereof. The blade part rotates inside the fan chassis. The motor part rotates the blade part. The control board controls the motor part. The fan device is arranged between a basal plate of the apparatus chassis and a bottom surface of the keyboard inside the apparatus chassis. The basal plate includes a first inlet at a position overlapping the first air intake. The keyboard includes, at a position overlapping the second air intake, a second inlet that makes air pass through the keyboard in an up-down direction thereof. The control board is attached to a back surface of a top surface of the fan chassis. The second air intake is provided around the control board. The electronic apparatus further includes a wall part arranged between the control board and the second air intake.

An electronic apparatus according to the third aspect of the present invention includes: an apparatus chassis including therein an electronic board; a keyboard provided on a top of the apparatus chassis; and a fan device that includes a fan chassis and a blade part. The fan chassis includes a first air intake formed on a bottom surface thereof, a second air intake formed on a top surface thereof, and an air outlet formed on a side surface thereof. The blade part rotates inside the fan chassis. The fan device is arranged between a basal plate of the apparatus chassis and a bottom surface of the keyboard inside the apparatus chassis. The basal plate includes a first inlet at a position overlapping the first air intake. The keyboard includes, at a position overlapping the second air intake, a second inlet that makes air pass through the keyboard in an up-down direction thereof. The electronic apparatus further includes a water stop wall that lies between a bottom plate forming a bottom surface of the fan device and an inner surface of the basal plate.

The above-described aspects of present invention can achieve both cooling performance and waterproof performance.

DETAILED DESCRIPTION OF THE INVENTION

Hereinafter, preferred embodiments of an electronic apparatus according to the present invention will be described in detail with reference to the accompanying drawings.

Figure 1:
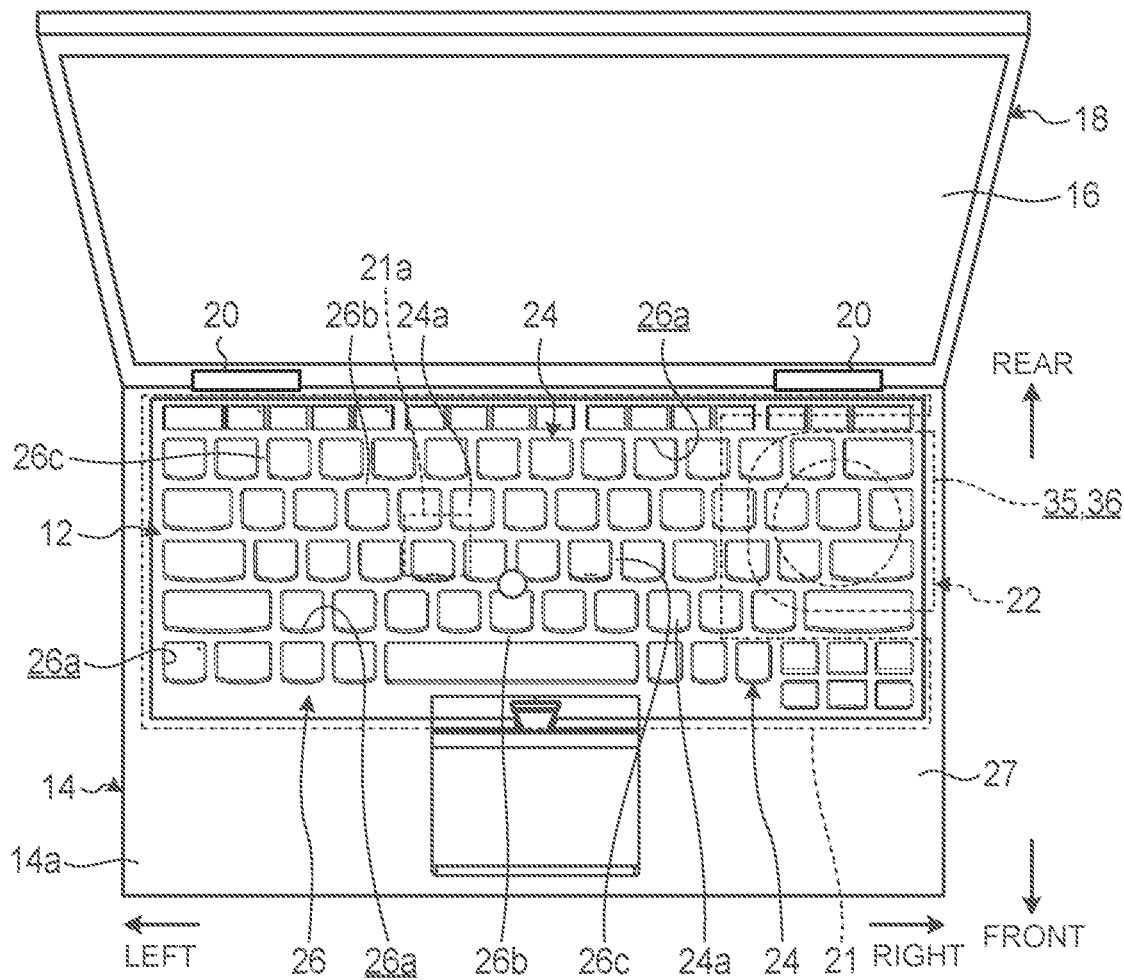
FIG. 1 is a plan view illustrating an electronic apparatus according to an embodiment.

FIG. 1 is a plan view illustrating an electronic apparatus 10 according to an embodiment. The electronic apparatus 10 includes an apparatus chassis 14 equipped with a keyboard 12 and a display chassis 18 equipped with a display 16. The electronic apparatus 10 is a clamshell laptop PC in which the apparatus chassis 14 and the display chassis 18 are connected by a hinge 20 so as to be relatively rotatable. FIG. 1 illustrates a state where the display chassis 18 is opened from the apparatus chassis 14 as a usage pattern. The electronic apparatus 10 may be also an electronic apparatus other than a clamshell laptop PC.

Hereinafter, based on a direction seen by a user who uses the keyboard 12 while looking at the display 16, the apparatus chassis 14 and the keyboard 12 mounted thereon will be described with the near side as the front, the far side as the rear, a thickness direction as the up and down, and a width direction as the left and right.

An electronic board 21 and a fan device 22 are housed inside the apparatus chassis 14. The electronic board 21 is a motherboard for the electronic apparatus 10, and is mounted with various semiconductor chips as well as a central processing unit (CPU) 21a. The fan device 22 is a blower fan to cool the CPU 21a and the like. A hard disk drive, a battery device, and the like not illustrated are further housed inside the apparatus chassis 14.

The keyboard 12 is provided on a top surface 14a of the apparatus chassis 14. The keyboard 12 includes a plurality of key switches 24. The keyboard 12 is an isolation keyboard in which the surrounding area of a key top 24a that is an operating surface of each of the key switches 24 is partitioned by a frame (isolation frame) 26.

The frame 26 is formed of resin, metal, or the like. The frame 26 is a net-like frame. The frame 26 according to the present embodiment is integrally formed with a cover member 27 that forms the top surface 14a of the apparatus chassis 14. The frame 26 may be configured separately from the cover member 27. The frame 26 includes a plurality of holes 26a into which the key tops 24a can move vertically. The frame 26 includes the holes 26a that are portions surrounded by horizontal frame portions 26b extending in the right-left direction and vertical frame portions 26c extending in the front-and-rear direction.

The display chassis 18 includes the display 16 on the front surface. The display 16 is a liquid crystal display, for example. The bottom end of the display chassis 18 is connected to the rear end of the apparatus chassis 14 via the hinge 20.

Figure 2:
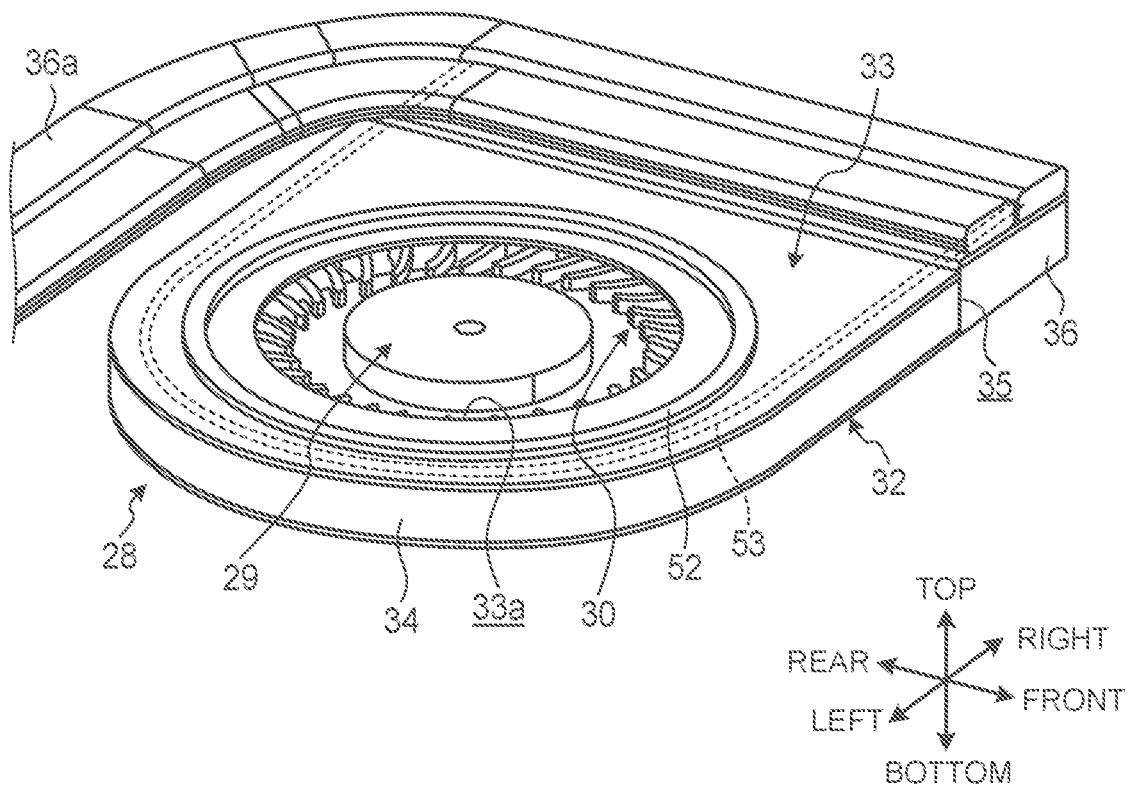
FIG. 2 is a perspective view illustrating a fan device.

FIG. 2 is a perspective view illustrating the fan device 22. As illustrated in FIG. 2, the fan device 22 includes a fan chassis 28, a rotating part 29, and a blade part (impeller part) 30. The fan device 22 is a centrifugal fan in which the rotating part 29 is rotated by a motor part and thus the blade part 30 provided on its outer circumferential side is rotated.

The fan chassis 28 stores therein the rotating part 29 and the blade part 30. The fan chassis 28 includes a bottom plate 32 forming a bottom surface, a top plate 33 forming a top surface, and a side wall plate 34 forming a side surface. Each of the plates 32 to 34 is a metal plate or a resin plate. The side wall plate 34 is a curved plate that covers a side portion of a space formed between the top plate 33 and the bottom plate 32.

The bottom plate 32 is a substantially bullet-shaped thin plate in which one side of a rectangular plate is formed in a circular shape. A first air intake 32a is formed in the center of the bottom plate 32 (see FIG. 4). The first air intake 32a is a circular hole formed coaxially with the rotating part 29 and exposes a part of the blade part 30 and the rotating part 29.

The top plate 33 has the same outer shape as the bottom plate 32. A second air intake 33a is formed in the center of the top plate 33. The second air intake 33a has the same shape and arrangement as the first air intake 32a. The second air intake 33a may have the shape or arrangement different from the first air intake 32a. The air intakes 32a and 33a are an opening for taking in the air outside of the fan chassis 28 to the inside by the rotation of the blade part 30.

Figure 4:
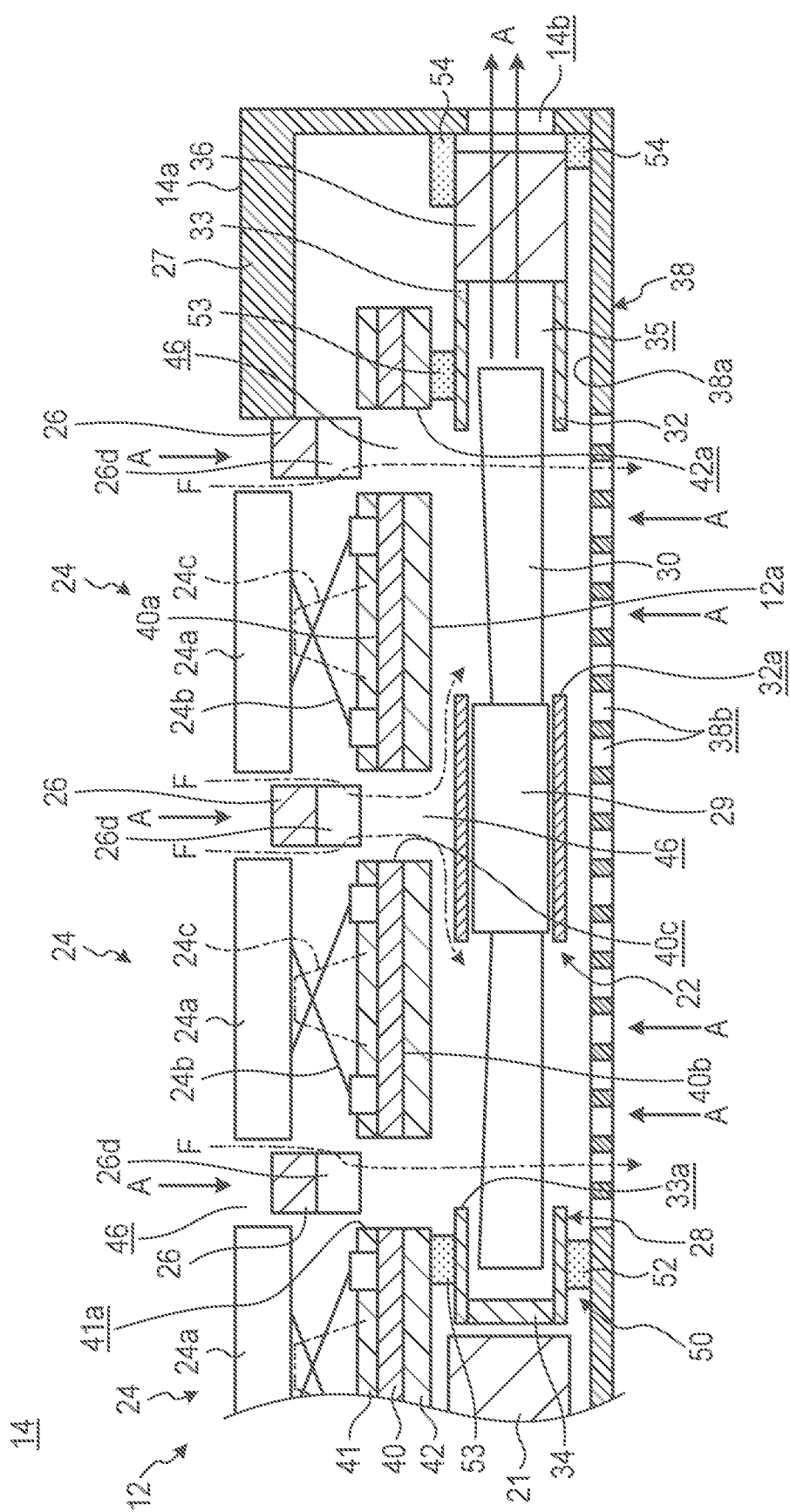
FIG. 4 is an enlarged side sectional view of essential parts schematically illustrating the internal structure of the apparatus chassis.

One side of the fan chassis 28 is not provided with the side wall plate 34, and the one side has a straight line instead of a circle to form an air outlet 35. Cooling fins 36 are provided at the air outlet 35. The cooling fins 36 are thermally connected to the CPU 21a via a heat pipe 36a. As a result, the fan device 22 discharges the heat of the CPU 21a carried by the heat pipe 36a to the outside by blowing air from the air outlet 35. As illustrated in FIGS. 1 and 4, the air outlet 35 and the cooling fins 36 face an outlet 14b formed on one side of the apparatus chassis 14.

Figure 3:
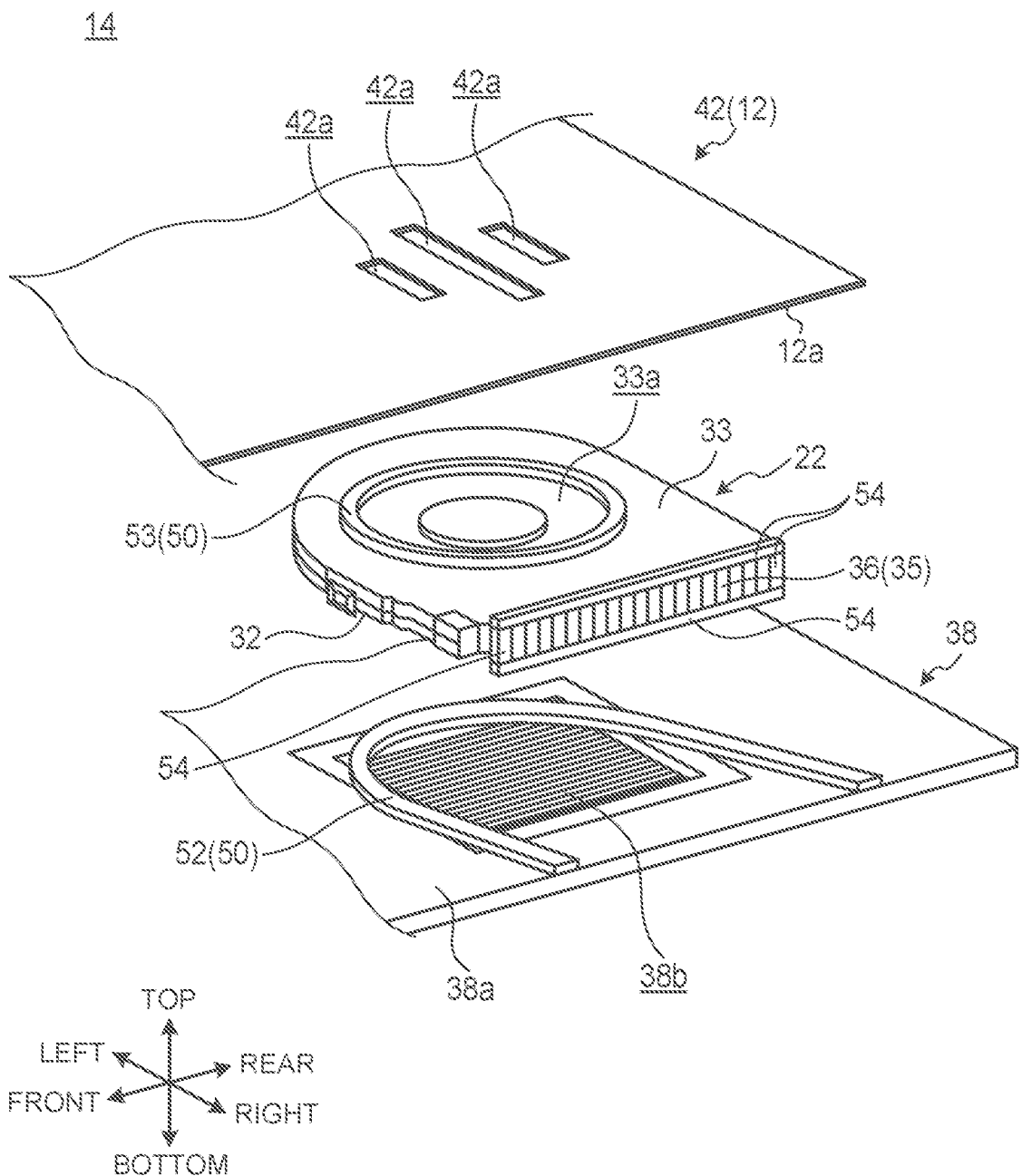
FIG. 3 is an enlarged exploded perspective view of essential parts schematically illustrating an internal structure of an apparatus chassis.
Figure 5:
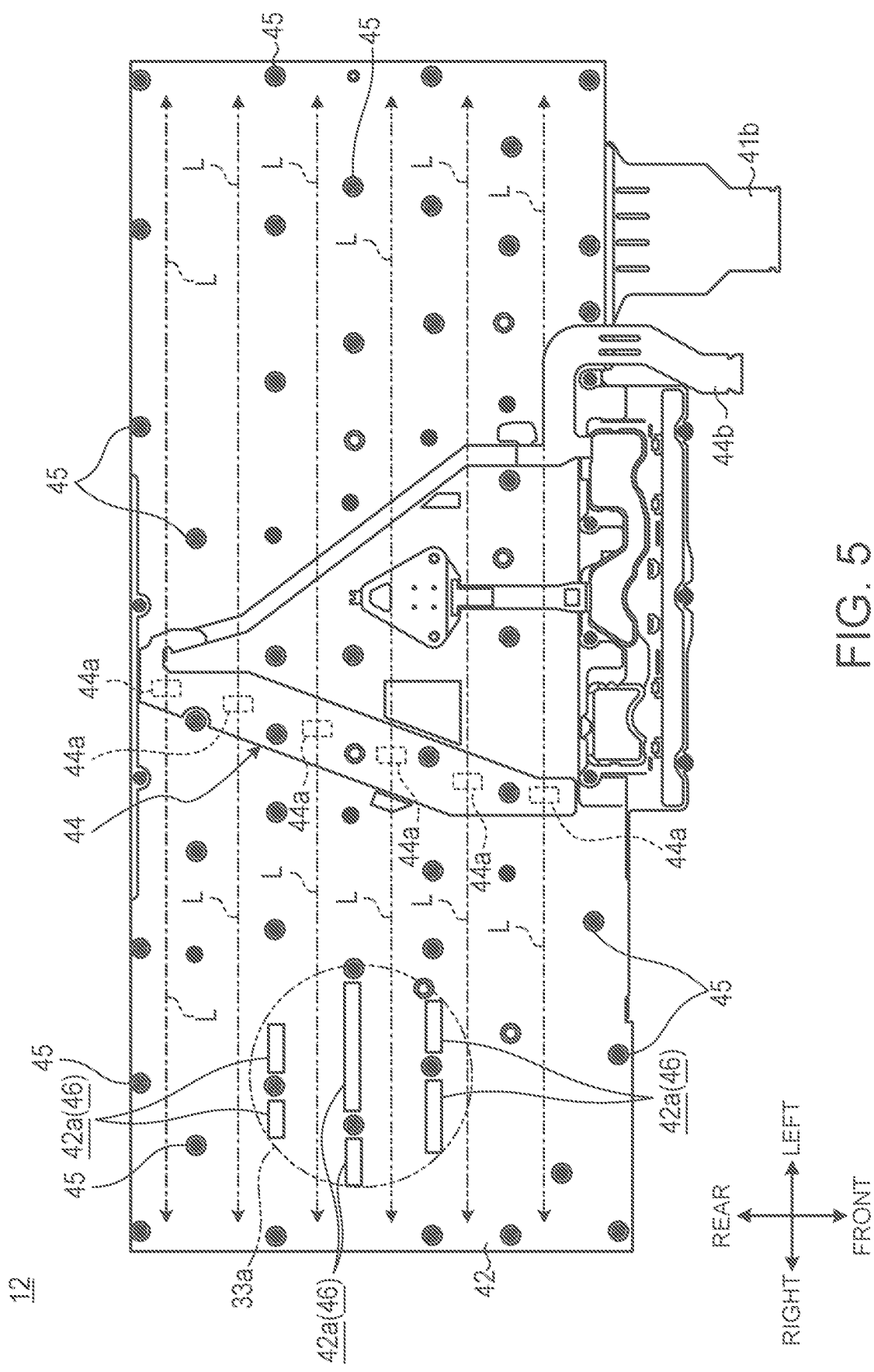
FIG. 5 is a bottom view illustrating a keyboard.
Figure 6:
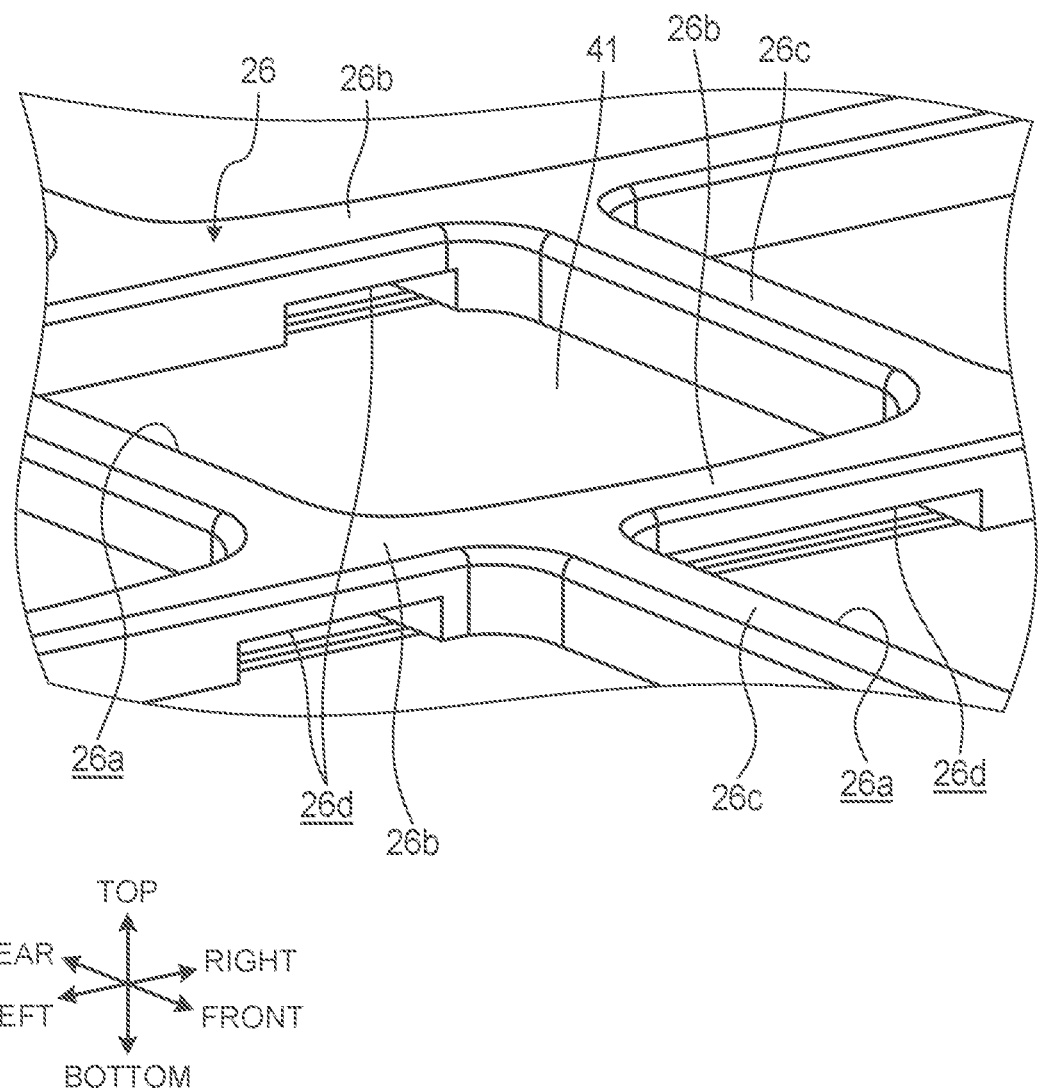
FIG. 6 is an enlarged perspective view illustrating a part of a frame.

FIG. 3 is an enlarged exploded perspective view of essential parts schematically illustrating the internal structure of the apparatus chassis 14. In FIG. 3, the key switches 24, the frame 26, a base plate 40, a membrane sheet 41, etc. are not illustrated. FIG. 4 is an enlarged side sectional view of essential parts schematically illustrating the internal structure of the apparatus chassis 14. FIG. 5 is a bottom view illustrating the keyboard 12. FIG. 6 is an enlarged perspective view illustrating a part of the frame 26.

As illustrated in FIGS. 3 and 4, the apparatus chassis 14 has a configuration that the fan device 22 is housed between an inner surface 38a of a basal plate 38 forming a basal surface and a bottom surface 12a of the keyboard 12. The electronic board 21 is provided to avoid the fan device 22 inside the apparatus chassis 14 (also see FIG. 1). First inlets 38b are formed in the basal plate 38. The first inlets 38b are an opening for introducing air A from the basal surface into the apparatus chassis 14, and have, for example, a configuration in which a plurality of slit-shaped holes are arranged in parallel. At least some of the first inlets 38b are provided, when being viewed from the top, close to a position overlapping the first air intake 32a of the fan chassis 28 to face the first air intake 32a.

As illustrated in FIG. 4, the keyboard 12 includes the plurality of key switches 24, the base plate 40, the membrane sheet 41, and a light guiding plate 42.

Each of the key switches 24 includes the key top 24a, a guide mechanism 24b, and a rubber dome 24c. The guide mechanism 24b supports the key top 24a on a top surface 40a side of the base plate 40 so as to be vertically movable. The guide mechanism 24b is a scissor mechanism that connects between the bottom surface of the key top 24a and the top surface 40a of the base plate 40. The rubber dome 24c is a dome-shaped member that is formed of elastic material having flexibility such as silicone rubber. The rubber dome 24c is arranged between the membrane sheet 41 and the key top 24a. The rubber dome 24c is an elastic member that presses the membrane sheet 41 when the key top 24a is depressed and returns the key top 24a to its original position when the depressing operation of the key top 24a is released.

The base plate 40 is an attachment plate for the key switches 24 and the frame 26. The base plate 40 is obtained by performing cut-and-raise molding and punching molding on a metallic plate-shaped member such as a thin stainless-steel plate and aluminum plate.

The membrane sheet 41 is stacked on the top surface 40a of the base plate 40. The membrane sheet 41 is a trilayer-structure switch sheet in which contacts are closed when being pressed, for example. The membrane sheet 41 closes contacts by making a fixed contact and a movable contact be in close contact with each other when a position at which the fixed contact and the movable contact overlap with each other is pressed for example. The membrane sheet 41 includes through-holes in various places, and the guide mechanism 24b and the frame 26 are supported by the top surface 40a of the base plate 40 through the through-holes.

The light guiding plate 42 is stacked on a bottom surface 40b of the base plate 40. The light guiding plate 42 is a resin plate or sheet having translucency such as PET, polycarbonate, and acrylic. A light source module 44 is attached to the light guiding plate 42 (see FIG. 5). The light source module 44 is attached to the left and right center portions of the light guiding plate 42, for example, and a plurality of light sources 44a are arranged in the front-and-rear direction. The light source module 44 is connected to the electronic board 21 via a wiring 44b formed of a flexible substrate, for example. The light sources 44a are an LED element, for example. The light guiding plate 42 guides light emitted from the light sources 44a in the right-left direction and reflects the light by a light reflecting surface to irradiate the key tops 24a from the back surfaces. The light guiding plate 42 may be omitted. In this case, a waterproof sheet may be used instead of the light guiding plate 42.

As illustrated in FIG. 5, the keyboard 12 is fixed to the frame 26 by a plurality of screws 45 fastened toward the top surface from the bottom surface 12a. The reference number 41b in FIG. 5 is a wiring formed of a flexible substrate etc. for connecting the membrane sheet 41 to the electronic board 21.

As illustrated in FIG. 4, second inlets 46 penetrating in the up-down direction are formed in the keyboard 12. Each of the second inlets 46 is an opening that makes the air A pass through the keyboard 12 in the up-down direction. At least some of the second inlets 46 are provided, when being viewed from the top, close to a position overlapping the second air intake 33a of the fan chassis 28 to face the second air intake 33a. More specifically, it is desirable that the second inlets 46 are opened just above the second air intake 33a of the fan chassis 28 and an opening ratio thereof is set to, for example, 30% or more with respect to the opening area of the second air intake 33a. Each of the second inlets 46 is configured by causing a gap between the adjacent key tops 24a and 24a, a hole 41a formed in the membrane sheet 41, a hole 40c formed in the base plate 40, and a hole 42a formed in the light guiding plate 42 to communicate with each other sequentially from top to bottom. When a waterproof sheet is used instead of the light guiding plate 42, the hole 42a may be formed in the waterproof sheet.

As illustrated in FIG. 5, the light guiding plate 42 guides in the left-right direction the light emitted from the light sources 44a arranged in the front-rear direction to make the key tops 24a emit light (see light L indicated by dashed lines in FIG. 5). In other words, the light L is guided to traverse the vertical frame portions 26c of the frame 26 when being viewed from the top, and makes the key tops 24a emit light from the bottoms. Therefore, in case of the present embodiment, the light guiding plate 42 is formed with the holes 42a at only positions overlapping under the horizontal frame portions 26b of the frame 26 (see FIG. 5). The holes 42a are long holes that extend in the left-right direction. As a result, it is possible to avoid a state in which the hole 42a blocks the light guide of the light L and the key top 24a on the downstream side in the light guide direction of the light L from the hole 42a does not emit light.

As described above, because the plurality of screws 45 penetrates through the light guiding plate 42, the screws 45 are also placed only at positions overlapping under the horizontal frame portions 26b of the frame 26 to avoid the non-luminous state of some of the key tops 24a. In other words, the screws 45 are also arranged under the horizontal frame portions 26b. For this reason, in the present embodiment, the holes 42a are formed at positions at which the screws 45 are not located, for example, between the adjacent screws 45 and 45 in the left-right direction (see FIG. 5). As a result, in the electronic apparatus 10, neither the holes 42a or the screws 45 fixing the keyboard 12 obstruct the light guide on the light guiding plate 42, and the opening area of the holes 42a can be secured at a maximum.

In the electronic apparatus 10, as illustrated in FIG. 4, the fan device 22 takes in the air A under the apparatus chassis 14 via the first air intake 32a from the first inlets 38b of the basal plate 38. At the same time, the fan device 22 takes in the air A above the apparatus chassis 14 via the second air intake 33a from the second inlets 46 of the keyboard 12. Then, when discharging the air A sucked from the air intakes 32a and 33a outside the apparatus chassis 14 via the air outlet 35 and the outlet 14b, the fan device 22 air-cools the cooling fins 36. Therefore, the electronic apparatus 10 can obtain high cooling efficiency because the fan device 22 can sufficiently take in the air A from the top and bottom surfaces of the apparatus chassis 14. In particular, the electronic apparatus 10 includes the second inlets 46 provided in the keyboard 12 and thus can take in the air from above the apparatus chassis 14 to the inside. For this reason, even if the electronic apparatus 10 has the configuration that a gap is hardly between the top plate 33 of the fan chassis 28 and the bottom surface 12a of the keyboard 12 by making the apparatus chassis 14 as thin as possible and thus the air inside the apparatus chassis 14 cannot be favorably taken into the second air intake 33a from the gap, the electronic apparatus 10 can obtain high cooling efficiency.

Herein, as illustrated in FIGS. 4 and 6, the frame 26 according to the present embodiment includes cutout portions 26d formed in its bottom portion that abuts on the top surface of the membrane sheet 41. The cutout portions 26d are provided at positions corresponding to the second inlets 46. As a result, the electronic apparatus 10 prevents the frame 26 from interfering with the flow of the air A through the second inlets 46 to obtain higher cooling efficiency. In FIG. 6, the frame 26 exemplifies the configuration that the cutout portions 26d are formed in the horizontal frame portions 26b and the cutout portions 26d are not formed in the vertical frame portions 28c. However, the cutout portions 26d may be also provided in the vertical frame portions 28c because the cutout portions are not directly related to the light guide of the light L on the light guiding plate 42.

As described above, the electronic apparatus 10 includes the second inlets 46 that penetrate through the keyboard 12 in the up-down direction. For this reason, when a user spills liquid such as drink on the keyboard 12 by mistake for example, there is a concern that the second inlets 46 act as a liquid flow path and the inside of the apparatus chassis 14 is flooded. When the inside of the apparatus chassis 14 is flooded, there is a concern that an electronic component such as the electronic board 21 may be damaged or short-circuited.

Therefore, the electronic apparatus 10 includes a waterproof structure 50 that prevents water from entering the electronic board 21 and other electronic components inside the apparatus chassis 14. As illustrated in FIGS. 3 and 4, the waterproof structure 50 according to the present embodiment includes a first water stop member 52, a second water stop member 53, and a third water stop member 54.

The first water stop member 52 is a rod-shaped sealing member having a substantial U-shape for example (see FIG. 3). The first water stop member 52 may be made of any material as long as the member shows a predetermined water stop effect, but is preferably made of a flexible material. In the present embodiment, the first water stop member 52 employs a sponge-shaped sealing member called airtight waterproof packing with adhesive tape attached to one side of a foam such as EPDM (Ethylene Propylene Diene Monomer).

The first water stop member 52 lies between the surface of the bottom plate 32 of the fan chassis 28 and the inner surface 38a of the basal plate 38, and is attached firmly to both the surfaces. As a result, the first water stop member 52 becomes a wall that separates the first inlets 38b and the first air intake 32a from the electronic board 21 etc. inside the apparatus chassis 14. The first water stop member 52 is attached to the inner surface 38a or the bottom plate 32 and thus does not interfere with the removal of the basal plate 38. Because the first water stop member 52 is a flexible material, the first water stop member 52 does not excessively press the basal plate 38 and thus the basal plate 38 does not bend and warp. In the configuration example illustrated in FIG. 3, the first water stop member includes a U-shaped opening placed in a portion corresponding to the cover member 27 (see FIG. 4) close to the outlet 14b to construct a water stop structure using also the cover member 27. The first water stop member 52 may be formed in the same ring shape as that of the second water stop member 53.

The second water stop member 53 is a ring-shaped sealing member made of the same or similar material as the first water stop member 52. The second water stop member 53 lies between the surface of the top plate 33 of the fan chassis 28 and the bottom surface 12a of the keyboard 12, and is attached firmly to both the surfaces. The second water stop member 53 becomes a wall that separates the second inlets 46 and the second air intake 33a from the electronic board 21 etc. inside the apparatus chassis 14. The second water stop member 53 is attached to both of the bottom surface 12a and the top plate 33, for example. The second water stop member 53 may have the same U-shape as the first water stop member 52 to construct the same water stop structure as the first water stop member 52.

The third water stop member 54 is a rectangular ring-shaped sealing member made of the same or similar material as that of the first water stop member 52 and the second water stop member 53. The third water stop member 54 is attached to edges of the four circumferential surfaces of the cooling fins 36 on the outlet 14b side. The third water stop member 54 provided on the bottom surface of the cooling fins 36 is attached firmly to the inner surface 38a of the basal plate 38 (see FIG. 4). The third water stop member 54 provided on the top surface and the front-rear side surfaces of the cooling fins 36 is attached firmly to the inner surface of the cover member 27 (see FIG. 4).

Therefore, according to such the waterproof structure 50, as illustrated in FIG. 4, when liquid F from above the keyboard 12 enters the second inlets 46, it is possible to prevent the liquid F from entering a space outside of the fan device 22 inside the apparatus chassis 14 to enter the electronic board 21 etc. In other words, the liquid F that has entered from the second inlets 46 is sucked into the fan chassis 28 from the second air intake 33a under the water stop action of the second water stop member 53. A part of the liquid F is drained outside the apparatus chassis 14 via the first air intake 32a and the first inlets 38b under the water stop action of the first water stop member 52. In other words, the electronic apparatus 10 causes the second inlets 46, the second air intake 33a, the blade part 30, the first air intake 32a, and the first inlets 38b to also function as a drainage route of the liquid F. Moreover, the remainder of the liquid F flows into the air outlet 35 and the cooling fins 36 by blowing air from the blade part 30, and is drained outside the apparatus chassis 14 from the outlet 14b under the water stop action of the third water stop member 54.

In other words, the first water stop member 52 prevents the liquid F flowing outside of the fan chassis 28 from the first air intake 32a from flowing into a gap between the bottom plate 32 and the basal plate 38 and entering a space other than the fan chassis 28 inside the apparatus chassis 14. Moreover, the second water stop member 53 prevents the liquid F flowing out from the second inlets 46 from flowing into a gap between the top plate 33 of the fan chassis 28 and the bottom surface 12a of the keyboard 12 and entering the space other than the fan chassis 28 inside the apparatus chassis 14. Furthermore, the third water stop member 54 prevents the liquid F that has been blown to the cooling fins 36 from flowing into a gap between the cooling fins 36 and the inner surface of the cover member 27 on which the outlet 14b is formed and entering the space other than the fan chassis 28 inside the apparatus chassis 14.

Therefore, the electronic apparatus 10 can achieve both of high cooling performance by the fan device 22 using the inlets 38b and 46 and waterproof performance by the first water stop member 52 etc. Herein, examples of electronic components that are protected outside the waterproof structure 50 can include, for example, a solid state drive (SSD), various input-output ports and connection terminals, and the like as well as the electronic board 21 that is a motherboard. The electronic apparatus 10 according to the present embodiment obtains sufficient waterproof effects so as not to cause the failure of the electronic board 21 etc. when actually dropping several hundred cc of the liquid F from above the keyboard 12 with the configuration illustrated in FIGS. 3 and 4. Because the water stop members 52 to 54 can also expect not only waterproof but also dustproof effect, the water stop members can also prevent grit and dust that has entered from the inlets 38*b* and 46 from affecting the electronic board 21 etc.

Moreover, the electronic apparatus 10 includes the second inlets 46, the second air intake 33*a*, the first air intake 32*a*, and the first inlets 38*b* arranged in a straight line from top toward bottom. For this reason, the liquid F flowing in from the second inlets 46 is smoothly drained from the first inlets 38*b* on the basal surface in a state where the liquid is prevented from entering the surrounding area by the water stop members 52 and 53 etc.

As is apparent from FIG. 4, the liquid F that has entered from the second inlets 46 almost moves to the bottom portion of the fan device 22 by a gravitational force, and collects around the first air intake 32*a* and the inner surface 38*a* of the basal plate 38. Therefore, because the waterproof structure 50 obtains waterproof effects against a certain amount of the liquid F if the structure includes at least the first water stop member 52, the second water stop member 53 and the third water stop member 54 may be omitted. Moreover, because the amount of the liquid F sent to the air outlet 35 is assumed to be small, the waterproof structure 50 may omit only the third water stop member 54.

Figure 7:
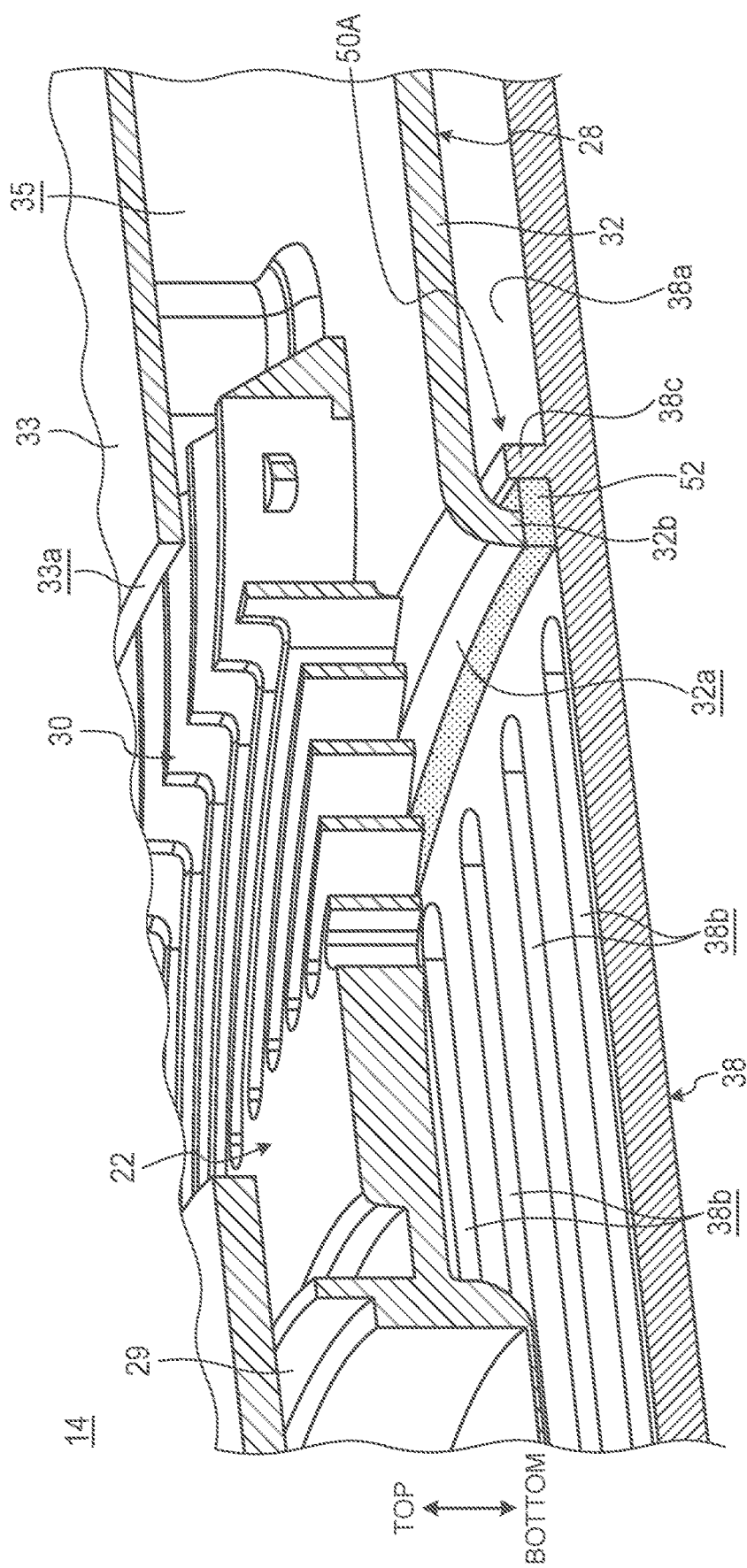
FIG. 7 is an enlarged perspective sectional view illustrating a part of the apparatus chassis that includes a waterproof structure according to a first modified example.

FIG. 7 is an enlarged perspective sectional view illustrating a part of the apparatus chassis 14 that includes a waterproof structure 50A according to a first modified example. The waterproof structure 50A illustrated in FIG. 7 differs in the configuration of peripheral parts of the first water stop member 52 compared to the waterproof structure 50 illustrated in FIG. 4. The waterproof structure 50A includes a bent part 32*b* and a rib 38*c* arranged side by side to engage with each other.

The bent part 32*b* is a R-shaped part in which a peripheral portion of the first air intake 32*a* of the bottom plate 32 of the fan chassis 28 is bent downward, and extends in a circumferential direction of the first air intake 32*a*. When the bottom plate 32 is made of metal, the bent part 32*b* may be formed by bending the peripheral portion of the first air intake 32*a* downward. When the bottom plate 32 is made of resin, the bent part 32*b* may be formed at the same time as the bottom plate 32 is molded.

The rib 38*c* is a protrusion that protrudes upward from the inner surface 38*a* of the basal plate 38, and extends in a ring shape so as to surround the first inlets 38*b*. The rib 38*c* may be integrally molded with the basal plate 38 or may be fixed separately. The rib 38*c* is provided adjacent to the first air intake 32*a* so as to surround the bent part 32*b* on the outside of the bent part 32*b*. The tip surfaces of the bent part 32*b* and the rib 38*c* overlap each other in the up-down direction. The first water stop member 52 is sandwiched between the tip surface of the bent part 32*b* and the inner surface 38*a* of the basal plate 38.

Therefore, in the waterproof structure 50A, the bent part 32*b* and the rib 38*c* are arranged so as to engage with each other from the up and down to form a water stop wall that surrounds the first air intake 32*a* and the first inlets 38*b*. For this reason, the waterproof structure 50A improves water stopping performance in the bottom portion of the fan device 22 in which the liquid F is easy to collect particularly, compared to the waterproof structure 50 illustrated in FIG. 4. The waterproof structure 50A can omit the first water stop member 52 by placing the bent part 32*b* and the rib 38*c* in contact with each other or very close to each other for example. Moreover, the waterproof structure 50A may use only the bent part 32*b* or only the rib 38*c* as a water stop wall with or without the water stop members 52 and 53 etc. Even with this configuration, in the bottom portion of the fan device 22 in which the liquid F is easy to collect, a gap between the bottom plate 32 and the basal plate 38 is shielded by the bent part 32*b* or the rib 38*c* to obtain waterproof performance.

Figure 8:
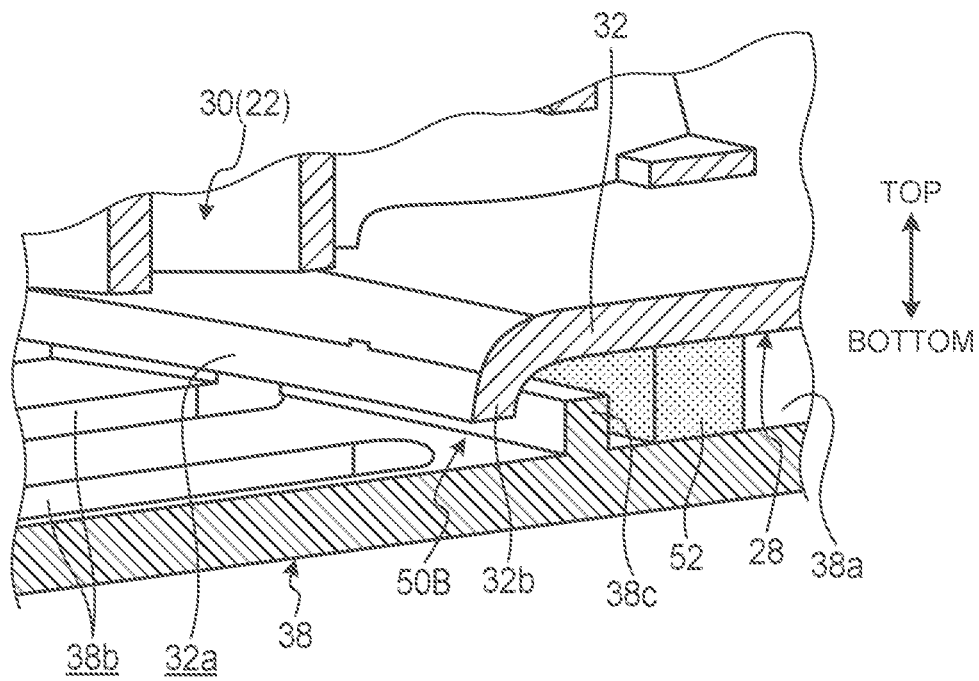
FIG. 8 is an enlarged perspective sectional view illustrating a part of the apparatus chassis that includes a waterproof structure according to a second modified example.

FIG. 8 is an enlarged perspective sectional view illustrating a part of the apparatus chassis 14 that includes a waterproof structure 50B according to a second modified example. The waterproof structure 50B illustrated in FIG. 8 differs in the arrangement of the first water stop member 52 compared to the waterproof structure 50A illustrated in FIG. 7. The first water stop member 52 of the waterproof structure 50B is arranged outside of the rib 38*c* with respect to the first air intake 32*a*, and lies between the inner surface 38*a* and the bottom plate 32. As a result, the waterproof structure 50B can obtain high waterproof effects in that a water stop wall by the first water stop member 52 is further arranged outside the water stop wall by the bent part 32*b* and the rib 38*c*.

Figure 9:
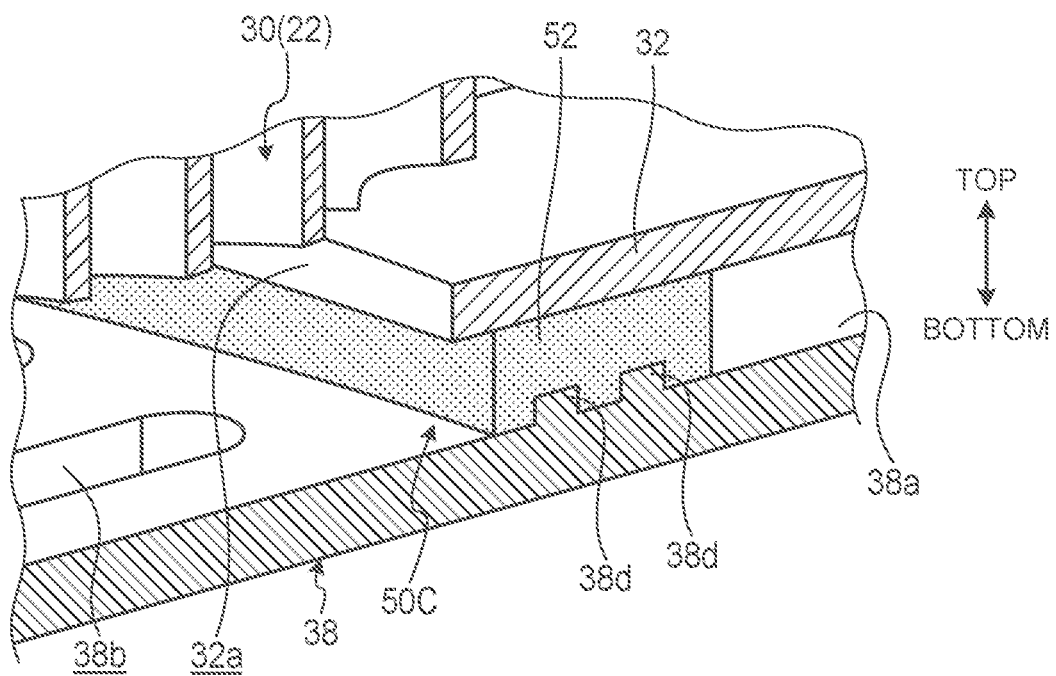
FIG. 9 is an enlarged cross-sectional perspective view illustrating a part of the apparatus chassis that includes a waterproof structure according to a third modified example.

FIG. 9 is an enlarged cross-sectional perspective view illustrating a part of the apparatus chassis 14 that includes a waterproof structure 50C according to a third modified example. The waterproof structure 50C illustrated in FIG. 9 differs in that the bent part 32*b* and the rib 38*c* are omitted, a pair of ribs 38*d* having the height lower than the rib 38*c* are arranged in parallel in the radial direction, and the first water stop member 52 is sandwiched between the ribs 38*d* and the bottom plate 32, compared to the waterproof structure 50A illustrated in FIG. 7. The number of the ribs 38*d* may be one. The waterproof structure 50C may be provided with the bent part 32*b*. As a result, although the waterproof structure 50C has a simple structure, the ribs 38*d* bite into the first water stop member 52 so as to obtain high waterproof effects.

Figure 10:
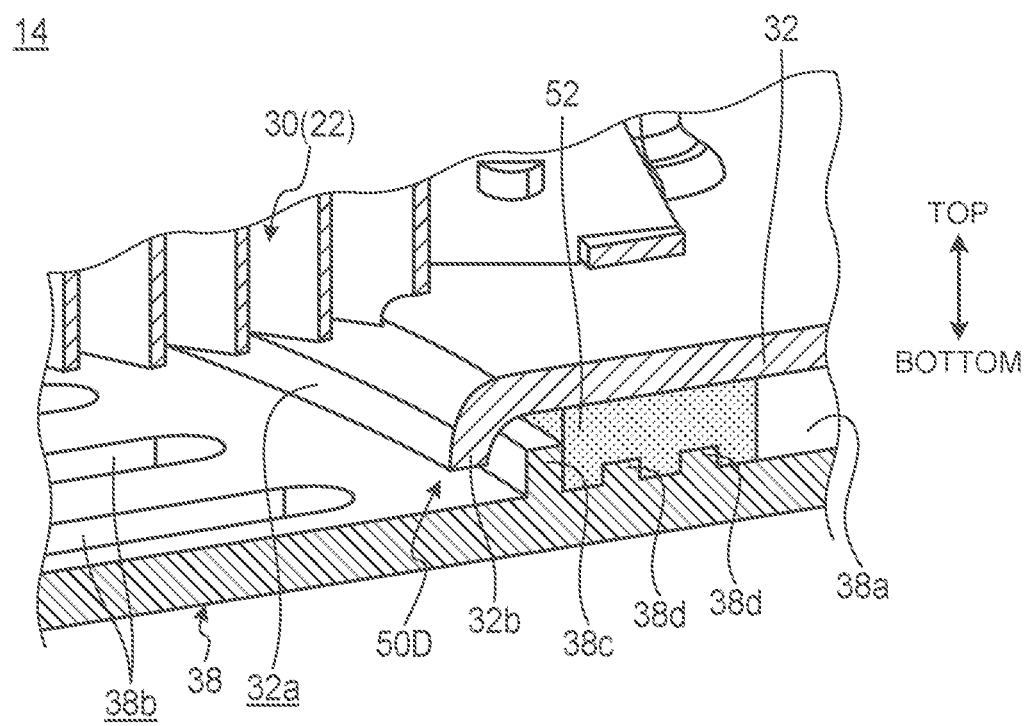
FIG. 10 is an enlarged cross-sectional perspective view illustrating a part of the apparatus chassis that includes a waterproof structure according to a fourth modified example.

FIG. 10 is an enlarged cross-sectional perspective view illustrating a part of the apparatus chassis 14 that includes a waterproof structure 50D according to a fourth modified example. The waterproof structure 50D illustrated in FIG. 10 has a configuration obtained by combining the waterproof structure 50B illustrated in FIG. 8 and the waterproof structure 50C illustrated in FIG. 9. In other words, the waterproof structure 50D has a configuration that the bent part 32*b* and the rib 38*c* are included and the first water stop member 52 is further sandwiched between a pair of the ribs 38*d* and the bottom plate 32. As a result, the waterproof structure 50D can obtain higher waterproof effects due to the water stop wall by the bent part 32*b* and the rib 38*c* and due to the bite of the ribs 38*d* into the first water stop member 52 on the outside thereof.

In the electronic apparatus 10, the liquid F flows into the fan device 22. However, because a general fan device has a certain level of waterproof property, it is rarely a big problem. Moreover, the fan device 22 can be more surely prevented from breaking down due to the entered liquid F by using a waterproof fan device. To further increase waterproof performance of the fan device 22, it is also effective to waterproof a control board mounted on the fan device 22 with UV coating, water-repellent coating, or the like, for example. However, a cost for a waterproof fan device and coating is high. Therefore, a configuration example to further improve waterproof performance of the fan device while suppressing the increase in a cost will be explained below.

Figure 11:
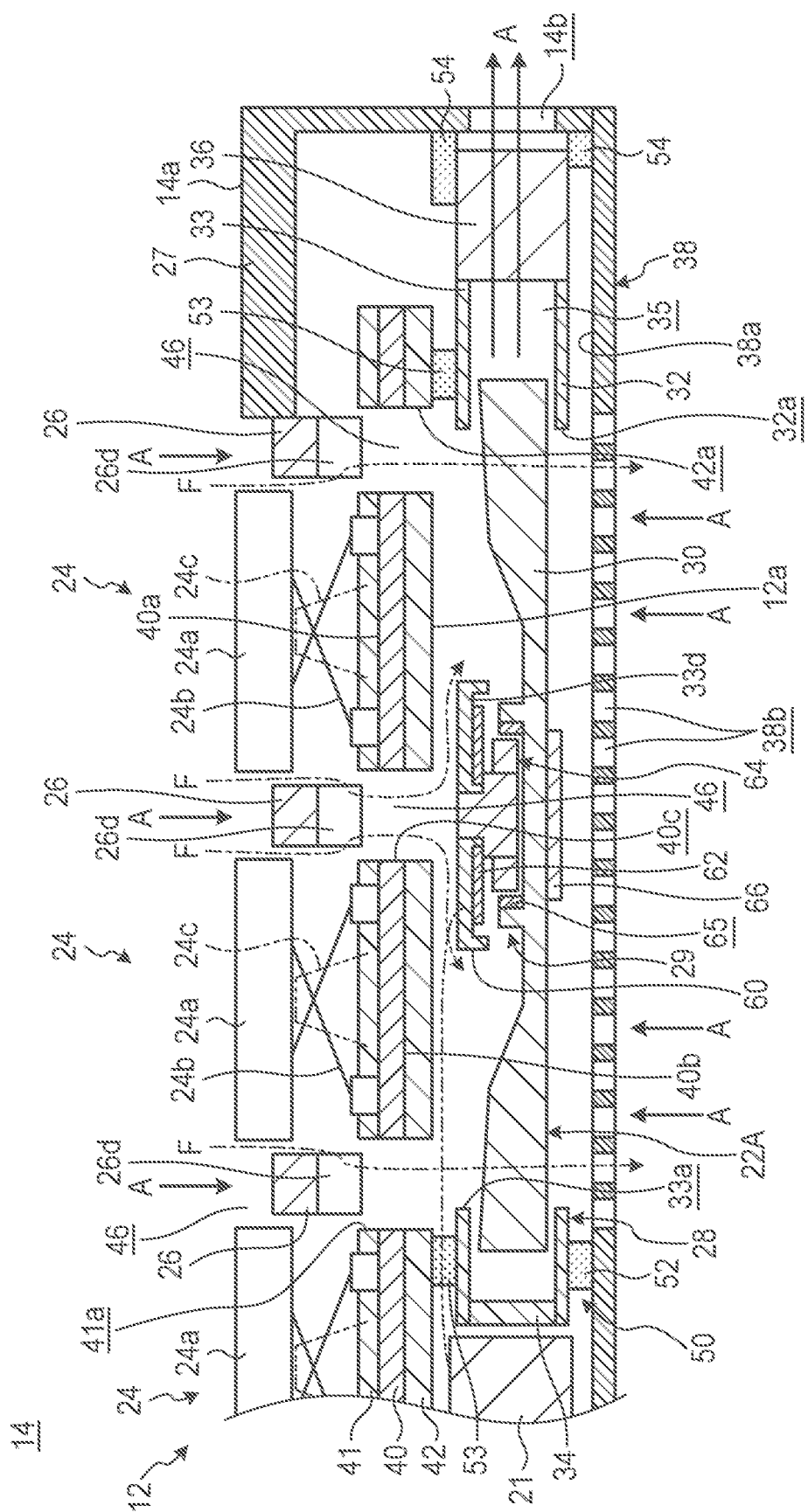
FIG. 11 is an enlarged side sectional view of essential parts schematically illustrating an internal structure of the apparatus chassis that includes a fan device according to a modified example.
Figure 12:
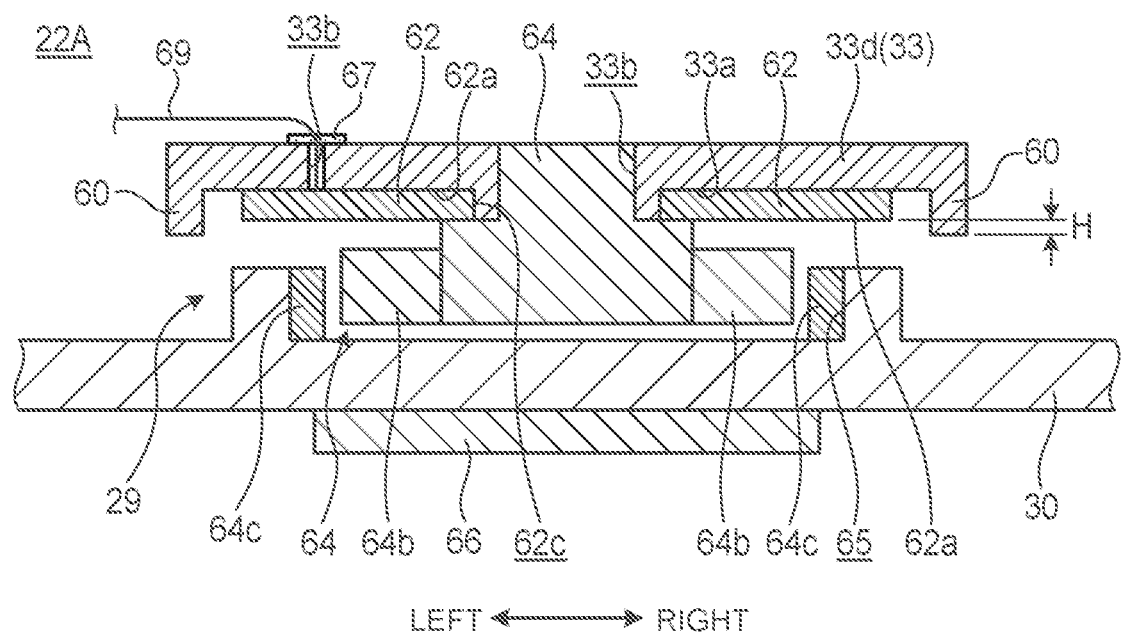
FIG. 12 is an enlarged side sectional view illustrating essential parts of the fan device illustrated in FIG. 11.

FIG. 11 is an enlarged side sectional view of essential parts schematically illustrating an internal structure of the apparatus chassis 14 that includes a fan device 22A according to a modified example. FIG. 12 is an enlarged side sectional view illustrating essential parts of the fan device 22A illustrated in FIG. 11. The fan device 22A illustrated in FIG. 11 differs in that waterproof wall parts 60 are included, compared to the fan device 22 as described above.

As illustrated in FIGS. 11 and 12, the fan device 22A includes the fan chassis 28, the rotating part 29, the blade part 30, a control board 62, and the wall parts 60. The blade part 30 has a slightly different shape from that of the fan device 22 described above but has the same function.

The rotating part 29 includes a motor part 64, a motor housing part 65, and a hub 66. The motor part 64 is configured to include a shaft part 64a and a coil part 64b that act as a stator and a magnet 64c that acts as a rotor. The shaft part 64a is arranged coaxially with the rotation center of the blade part 30 to support the coil part 64b on the outer circumference. A top end of the shaft part 64a is fitted into a shaft hole 33b formed in the top plate 33. As a result, the shaft part 64a and the coil part 64b are fixed integrally with the fan chassis 28. The coil part 64b has, for example, a structure in which a plurality of coils obtained by winding conducting wires are arranged in the circumferential direction of the shaft part 64a. The magnet 64c is fixed along the inner peripheral surface of the motor housing part 65 and faces the coil part 64b through a predetermined gap. The motor housing part 65 is an annular portion formed in the center of the blade part 30. The hub 66 is a metallic disk that closes a basal portion of the motor housing part 65.

The control board 62 is a board for drive control of the motor part 64. The control board 62 is fixed to a back surface 33c of the top plate 33. The control board 62 has an IC chip mounted on a downward mounting surface 62a. A wiring 69 is connected to the control board 62. The wiring 69 includes a signal line for control and a power line connected to the electronic board 21, for example. The wiring 69 is connected to the control board 62 through a hole 33b formed in the top plate 33, for example. The hole 33b is water-stopped with a tape material 67 for example.

In the fan device 22A, the coil part 64b is energized under the drive control of the control board 62 and thus the blade part 30 integrated with the magnet 64c rotates around the axis of the shaft part 64a. Although the explanation is omitted, the fan device 22 described above also includes the control board 62, the motor part 64, the motor housing part 65, and the hub 66. The fan device 22 may have a configuration that the control board 62 is placed at the bottom and the hub 66 is placed at the top.

Figure 13:
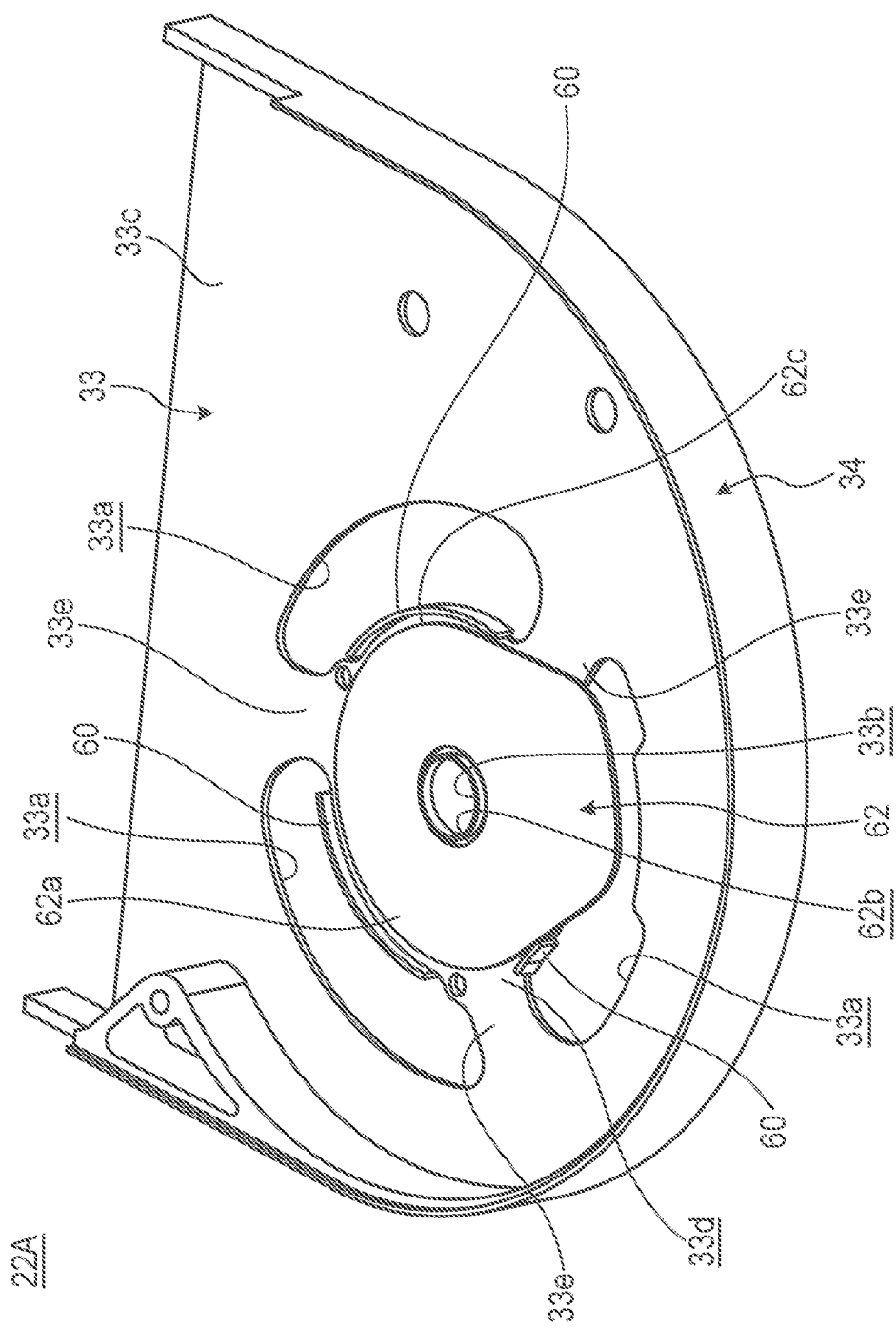
FIG. 13 is a perspective view of a top plate and its peripheral portions of the fan device illustrated in FIG. 11 as viewed from the back.
Figure 14:
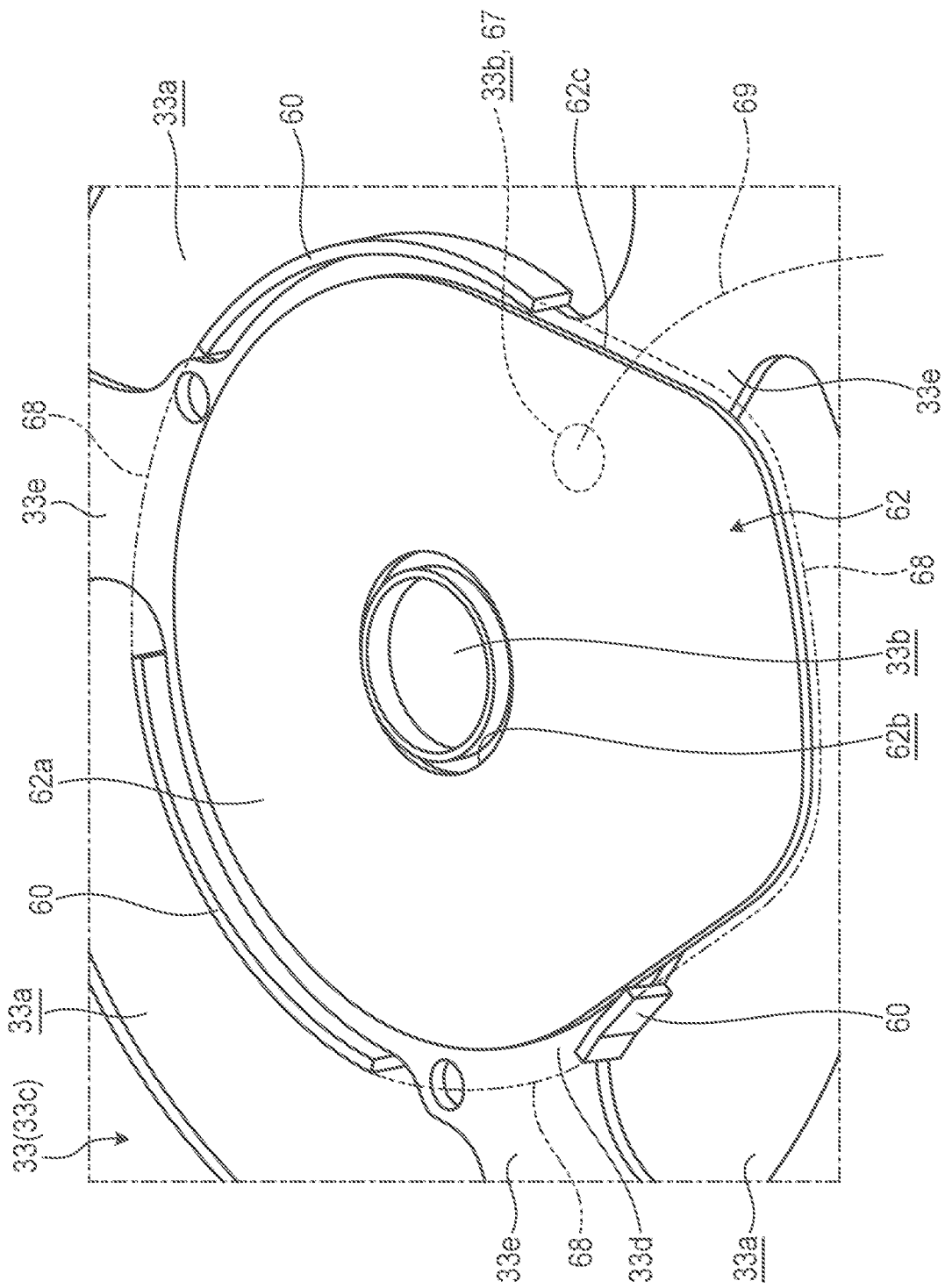
FIG. 14 is an enlarged view of a wall and its peripheral portions illustrated in FIG. 13.

FIG. 13 is a perspective view illustrating the top plate 33 and its peripheral portions of the fan device 22A illustrated in FIG. 11 as viewed from the back surface 33c side. FIG. 14 is an enlarged view illustrating the wall parts 60 and its peripheral portions illustrated in FIG. 13.

As illustrated in FIG. 13, in the fan device 22A, the top plate 33 includes a disk-shaped central plate 33d arranged like an island. The shaft hole 33b is formed in the center of the central plate 33d. The control board 62 includes a hole 62b formed in the center through which the shaft part 64a is passed. The control board 62 is supported by the shaft part 64a on the back surface 33c of the central plate 33d. The control board 62 may be fixed to the back surface 33c with screws etc. For example, the three second air intakes 33a are provided side by side so as to surround the surrounding area of the control board 62 and the central plate 33d in the circumferential direction. Each of the second air intakes 33a has a curved elliptical shape, for example. A bridge 33e that supports the central plate 33d is provided between the adjacent second air intakes 33a and 33a.

As illustrated in FIGS. 12 to 14, the wall parts 60 are arranged between an outer peripheral end face 62c of the control board 62 and the second air intakes 33a. The wall parts 60 are an eaves-shaped water stop wall to prevent the control board 62 from getting wet due to liquid L that has entered from the second inlets 46 of the keyboard 12. The wall parts 60 are a downward standing wall formed by bending the metallic top plate 33 downward. For example, for the top plate 33, plate pieces are previously formed on the inner peripheral portions (portion along the outer peripheral end face 62c of the control board 62) of the second air intakes 33a. The wall parts 60 can be easily formed by bending the plate pieces downward.

As illustrated in FIG. 12, it is desirable that the bottom ends of the wall parts 60 are located below the mounting surface 62a of the control board 62 (see height H in FIG. 12). By doing so, it is possible to more surely prevent the liquid L flowing along the outer surfaces of the wall parts 60 from entering the insides of the wall parts 60 to make the control board 62 get wet. The wall parts 60 may be used together with the waterproof structures 50A to 50D in addition to the waterproof structure 50 described above. The same applies to wall parts 60A and 60B to be described later.

As illustrated in FIG. 14, the fan device 22A includes the bridge 33e located between the adjacent second air intakes 33a and 33a. For this reason, the wall parts 60 are difficult to be formed so as to surround the entire periphery of the outer peripheral end face 62c of the control board 62. In the configuration example illustrated in FIG. 14, the three wall parts 60 are intermittently arranged so as to surround the outer peripheral end face 62c of the control board 62. As illustrated by the two-dot chain lines in FIG. 14, gaps between the wall parts 60 and 60 may be closed with water stop tapes 68. The water stop tapes 68 are a polyester adhesive tape for example. The water stop tapes 68 function as a substitute for the wall parts 60, for example, by bending the tapes into an L-shaped cross section, fixing one side of the L-shaped cross section to the top surface of the top plate 33, and making the other side hang from the second air intakes 33a downward. In the configuration example illustrated in FIG. 14, a part of the outer peripheral end face 62c of the control board 62 protrudes up to a position overlapping one of the second air intakes 33a. Because the wall part 60 cannot be placed on this protruding portion, the protruding portion is waterproofed with the water stop tape 68 similar to the other portions.

Figure 15:
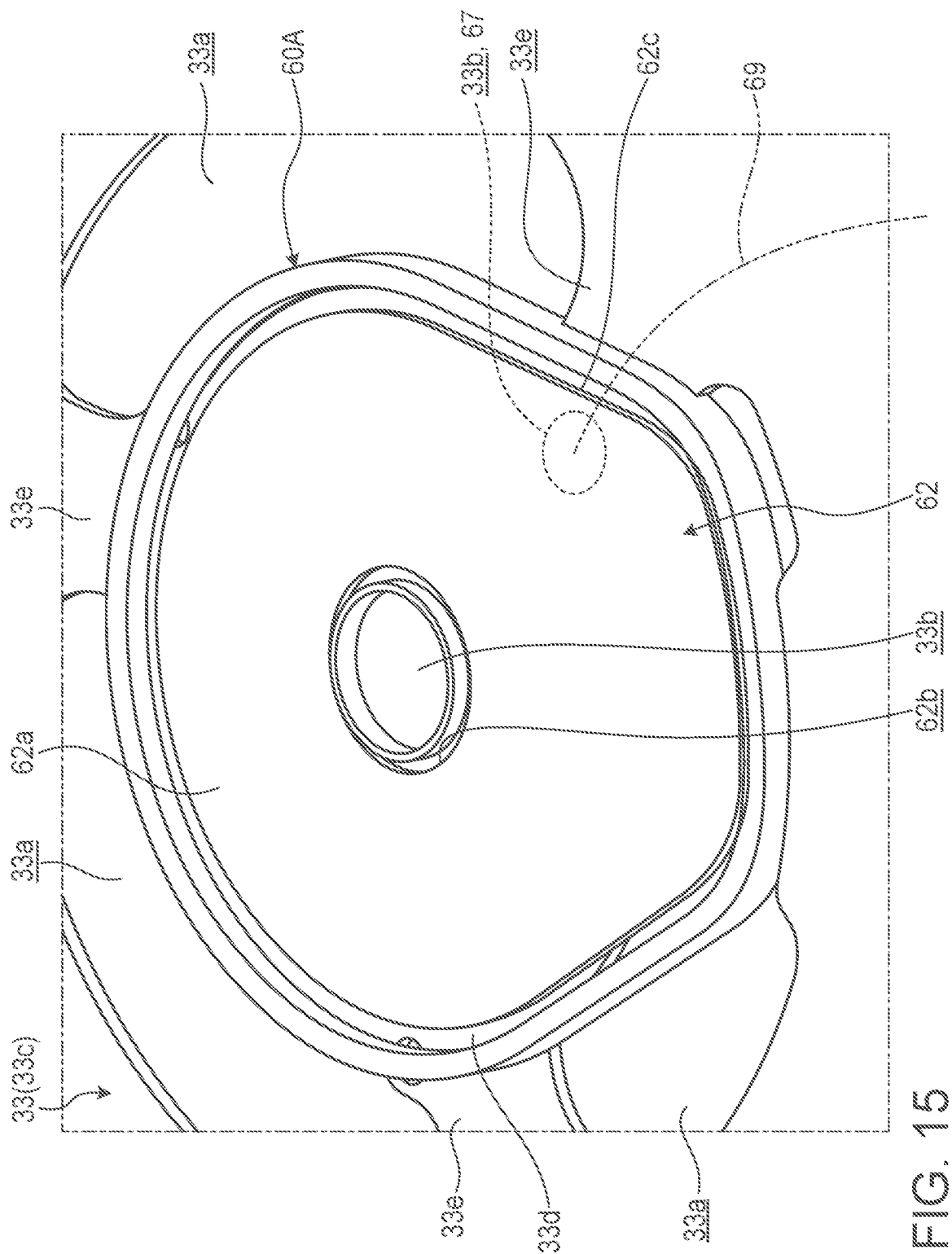
FIG. 15 is an enlarged perspective view illustrating a wall and its peripheral portions according to a third modified example.

FIG. 15 is an enlarged perspective view illustrating the wall part 60A and its peripheral portions according to a third modified example. As illustrated in FIG. 15, the wall part 60A is configured in an annular shape so as to surround the entire periphery of the outer peripheral end face 62c of the control board 62. The wall part 60A is a resin component fixed to the back surface 33c of the metallic top plate 33 by integral molding (insert molding) for example. Because the wall part 60A can completely surround the surrounding area of the control board 62, high waterproof effects are obtained. The wall part 60A may have a configuration that a resin component, a rubber member, etc. formed in an annular shape is fixed to the back surface 33c with an adhesive or a double-sided tape. When the top plate 33 is made of resin, the wall part 60A may be integrally molded with the molding resin of the top plate 33.

Even in the configuration example illustrated in FIG. 15, a part of the outer peripheral end face 62c of the control board 62 protrudes up to a position overlapping one of the second air intakes 33a. A gap is formed between the wall part 60A and the top surface of the protruding portion. This gap may be waterproofed with the same water stop tape 68 as that of the configuration example illustrated in FIG. 14.

Figure 16:
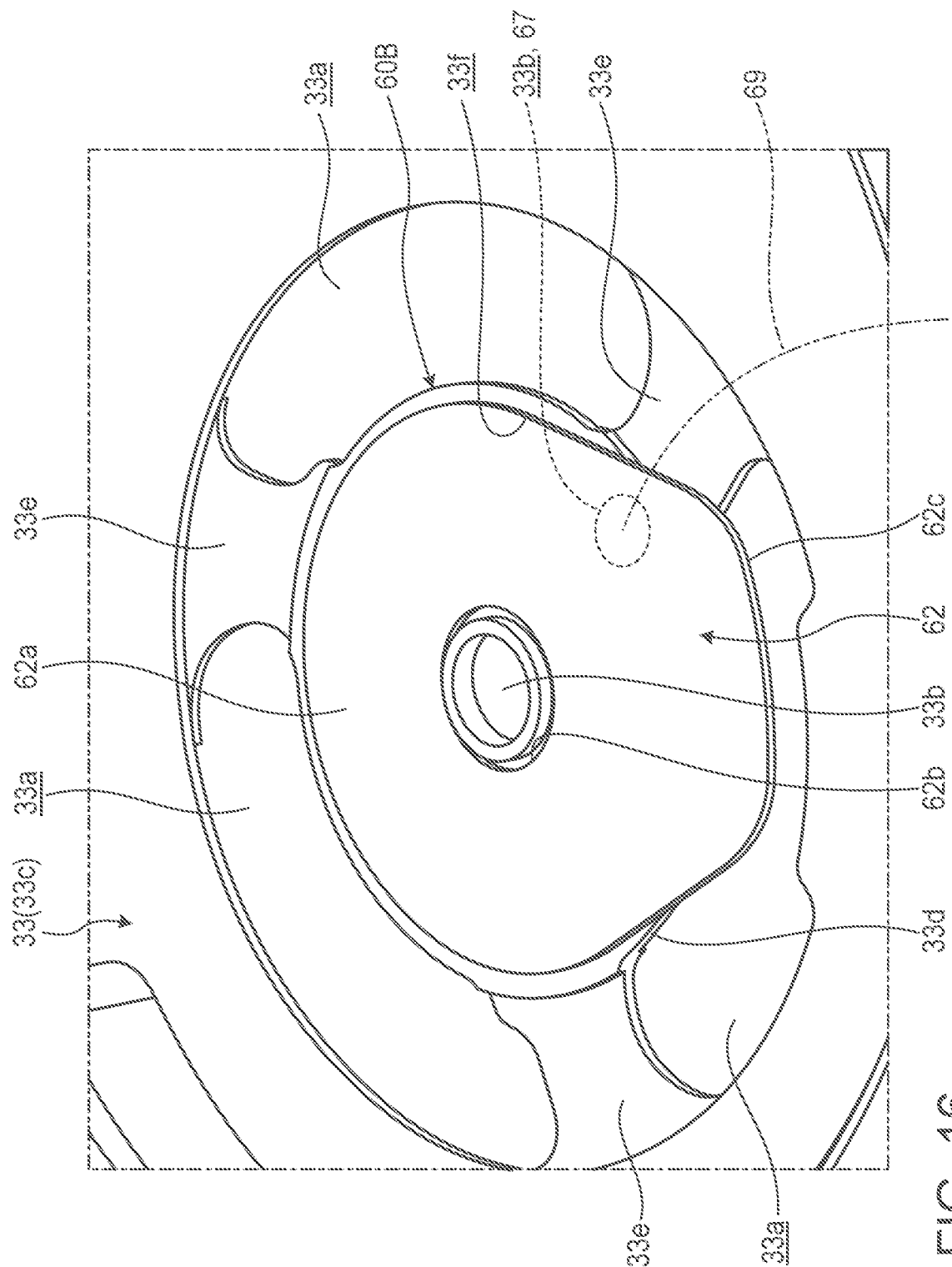
FIG. 16 is an enlarged perspective view illustrating a wall and its peripheral portions according to a fourth modified example.
Figure 17:
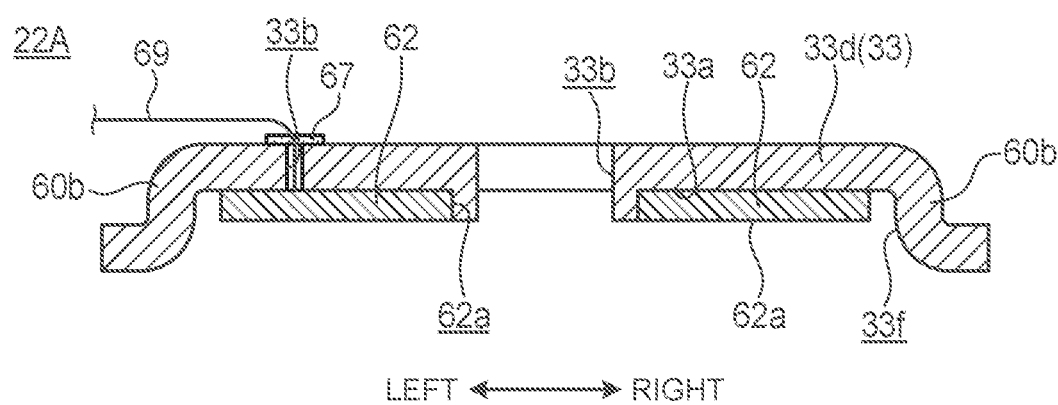
FIG. 17 is an enlarged side sectional view illustrating essential parts of the fan device that includes the wall illustrated in FIG. 16.

FIG. 16 is an enlarged perspective view illustrating the wall part 60B and its peripheral portions according to a fourth modified example. FIG. 17 is an enlarged side sectional view illustrating essential parts of the fan device 22A that includes the wall part 60B illustrated in FIG. 16. As illustrated in FIGS. 16 and 17, the wall part 60B is formed by a side wall forming the outer periphery of a concave 33f formed on the central plate 33d of the top plate 33. The concave 33f is formed, for example, on the central plate 33d of the metallic top plate 33 by drawing etc. from the back surface 33c side. As a result, a dome protruding upward is formed in the central plate 33d, and the inside of this dome becomes the concave 33f. The control board 62 is placed in the concave 33f, and thus the mounting surface 62a is arranged above the bottom end of the wall part 60B. Because the wall part 60B can also completely surround the surrounding area of the control board 62, high waterproof effects are obtained.

Even in the configuration example illustrated in FIG. 16, a part of the outer peripheral end face 62c of the control board 62 protrudes up to a position overlapping one of the second air intakes 33a. This protruding portion cannot be surrounded by the wall part 60B. This portion may be waterproofed with the same water stop tape 68 as that of the configuration example illustrated in FIG. 14.

The present invention is not limited to the embodiments as described above, and the embodiments can be freely changed without departing from the gist of the present invention.

As above, there has been illustrated the configuration that the frame 26 is integrally molded with the cover member 27 and the keyboard 12 is fixed to the frame 26 from below. However, the electronic apparatus 10 may have, for example, the configuration that a shallow concave is provided on the top surface 14a of the cover member 27 and the keyboard 12 is fixed to the concave from above. In the case of this configuration, the second inlets 46 may be configured to form the same holes as the holes 42a etc. on the basal surface of the concave of the cover member 27.

The invention claimed is:
1. An electronic apparatus comprising:
an apparatus chassis including therein an electronic board;
a keyboard on a top of the apparatus chassis; and
a fan device that includes:
   a fan chassis that includes a first air intake formed on a bottom surface of the fan chassis, a second air intake formed on a top surface of the fan chassis, and an air outlet formed on a side surface of the fan chassis; and
   a blade part that rotates inside the fan chassis,
the fan device is between a basal plate of the apparatus chassis and a bottom surface of the keyboard, and is inside the apparatus chassis, wherein
the basal plate includes a first inlet at a position overlapping the first air intake,
the keyboard includes, at a position overlapping the second air intake, a second inlet that makes air pass through the keyboard, and
the electronic apparatus further comprises a first water stop member that surrounds at least a part of the first air intake, lies between the bottom surface of the fan chassis and an inner surface of the basal plate, and separates the first air intake from the electronic board;
the keyboard includes:
   a plurality of key tops; and
   a net-like frame that separates the key tops from each other, and
the second inlet includes a hole at a position overlapping a horizontal frame portion.

2. The electronic apparatus according to claim 1, further comprising:
a second water stop member that surrounds at least a part of the second air intake, lies between the top surface of the fan chassis and the bottom surface of the keyboard, and separates the second air intake from the electronic board.

3. The electronic apparatus according to claim 1, further comprising:
a cooling fin at the air outlet of the fan device; and
a third water stop member that lies at least between a bottom surface of the cooling fin and the inner surface of the basal plate.

4. The electronic apparatus according to claim 1, wherein the keyboard is fixed to the frame by a plurality of screws, and
at least a part of the second inlet is between adjacent screws among the plurality of screws.

5. The electronic apparatus according to claim 1, wherein the fan device further includes:
a motor part that rotates the blade part; and
a control board that controls the motor part,
the control board is attached to a back surface of the top surface of the fan chassis,
the second air intake is around the control board, and
the electronic apparatus further comprises a wall part between the control board and the second air intake.

6. The electronic apparatus according to claim 5, wherein the wall part is a standing wall that extends from the back surface, and
a bottom end of the wall part is near a surface of the control board.

7. The electronic apparatus according to claim 5, wherein a top plate forming the top surface of the fan chassis is made of metal, and
the wall part is formed of a resin component and is integrally molded with the top plate.

8. The electronic apparatus according to claim 5, wherein a top plate forming the top surface of the fan chassis is made of metal, and
the wall part is formed by bending an inner peripheral portion of the second air intake formed on the top plate.

9. The electronic apparatus according to claim 5, wherein a top plate forming the top surface of the fan chassis is made of metal, and
the wall part is formed by a side wall of a concave formed on the top plate.

10. An electronic apparatus comprising:
an apparatus chassis including therein an electronic board;
a keyboard on a top of the apparatus chassis; and
a fan device that includes:
   a fan chassis that includes a first air intake formed on a bottom surface of the fan chassis, a second air intake formed on a top surface of the fan chassis, and an air outlet formed on a side surface of the fan chassis; and
   a blade part that rotates inside the fan chassis, the fan device is between a basal plate of the apparatus chassis and a bottom surface of the keyboard, and is inside the apparatus chassis, wherein
the basal plate includes a first inlet at a position overlapping the first air intake,
the keyboard includes, at a position overlapping the second air intake, a second inlet that makes air pass through the keyboard, and
the electronic apparatus further comprises a first water stop member that surrounds at least a part of the first air intake, lies between the bottom surface of the fan chassis and an inner surface of the basal plate, and separates the first air intake from the electronic board;
wherein a bottom plate forming the bottom surface of the fan chassis includes a bent part in which a peripheral portion of the first air intake is bent;
wherein the first water stop member is sandwiched between a tip surface of the bent part and the inner surface of the basal plate.

11. An electronic apparatus comprising:
an apparatus chassis including therein an electronic board;
a keyboard on a top of the apparatus chassis; and
a fan device that includes:
    a fan chassis that includes a first air intake formed on a bottom surface of the fan chassis, a second air intake formed on a top surface of the fan chassis, and an air outlet formed on a side surface of the fan chassis; and
    a blade part that rotates inside the fan chassis,
the fan device is between a basal plate of the apparatus chassis and a bottom surface of the keyboard, and is inside the apparatus chassis, wherein
the basal plate includes a first inlet at a position overlapping the first air intake,
the keyboard includes, at a position overlapping the second air intake, a second inlet that makes air pass through the keyboard, and
the electronic apparatus further comprises a first water stop member that surrounds at least a part of the first air intake, lies between the bottom surface of the fan chassis and an inner surface of the basal plate, and separates the first air intake from the electronic board;
wherein the inner surface of the basal plate includes a rib that extends to surround the first inlet;
wherein the first water stop member is sandwiched between the rib and a bottom plate forming the bottom surface of the fan chassis.

\* \* \* \* \*